United States Patent [19]

Kock

[11] 4,355,323
[45] Oct. 19, 1982

[54] COUPLER COMPRISING A LIGHT SOURCE AND LENS

[75] Inventor: Hendrikus G. Kock, Eindhoven, Netherlands

[73] Assignee: U.S. Philips Corporation, New York, N.Y.

[21] Appl. No.: 150,386

[22] Filed: May 16, 1980

[30] Foreign Application Priority Data

May 31, 1979 [NL] Netherlands .................. 7904283

[51] Int. Cl.$^3$ .............................. H01L 23/02
[52] U.S. Cl. .................................. 357/74
[58] Field of Search ............ 357/72, 74; 350/96.18, 350/96.20, 417

[56] References Cited
U.S. PATENT DOCUMENTS 3,816,847 6/1974 Nagao ............................ 357/74
4,186,995 2/1980 Schumacher .................. 350/96.18
4,295,152 10/1981 Khoe et al. ..................... 357/74

OTHER PUBLICATIONS

"High-Efficiency Long-Lived GaAlAs LED's for Fiber-Optical Communications", Masayuki Abe et al., IEEE Transactions on Electron Devices, vol. ED-24, No. 7, Jul. 1977, pp. 990-994.

Primary Examiner—R. A. Rosenberger
Attorney, Agent, or Firm—Marc D. Schechter

[57] ABSTRACT

For many optical communications systems, a semiconductor laser must be situated at an exact position and at an exact distance from a first optical element (for example a lens) of the optical system coupled to the laser. This is achieved according to the invention by arranging the laser in a bushing-shaped cover on which a flange is formed. A holder with a lens is secured on this flange by way of a plastic metal solder layer. The lens can be placed at the correct position and at the correct distance from the laser by sliding and by pressing on the holder. The solder layer is then plastically deformed while the space in which the laser is accommodated remains hermetically sealed.

7 Claims, 2 Drawing Figures

COUPLER COMPRISING A LIGHT SOURCE AND LENS

BACKGROUND OF THE INVENTION

The invention relates to a coupling element, comprising a light source and a (lens-shaped element). The light source is mounted on a support on which a cover is secured. The lens is situated opposite the light source in the path of the light beam emitted from the source. The light beam is directed transverse to the support.

A coupling element of this kind is described in an article entitled "High-Efficiency Long-Lived GaAlAs LED's for Fiber-Optical Communication" by Masayuki Abe et al. (IEEE Transactions on Electron Devices, Vol. ED-24, No. 7, July 1977, pages 990–994). The described coupling element makes use of a light-emitting diode, but could alternatively use a semiconductor laser as the light source. Furthermore, the lens is an end of an optical fiber in which the light generated by the diode is radiated.

The coupling element described in the above-mentioned article is used in an optical communications system where data is transmitted by means of light pulses. The light pulses are transmitted via optical fibers. However, besides the lens on the end of the optical fiber, the coupling element may also include other optical elements such as lenses, semitransparent mirrors, etc. A coupling element of this kind can be used, for example, in a video or audio disc/reading device (also referred to as Video Long Play and Audio Long Play apparatus, respectively) in which the data stored on a disc is read optically. The means for optically reading the data on the disc includes at least the light source, the lens, a reflective surface of the video/audio disc, and a light detector.

In order to maximize the transmission of light to the optical element situated behind the lens, the lens should be situated at an optimum position and at an optimum distance with respect to the light source. The above-mentioned article describes how to adjust the two optical elements to the optimum positions and distance.

During the adjustment produce, the amount of light radiated into the fiber via the lens is measured. The cover, in which the optical fiber is secured by means of an epoxy resin, is displaced with respect to the support until the amount of light measured is maximum. The cover is then maintained in this position until the epoxy resin used for securing the cover to the support has set; this is a drawback in view of the time required for manufacturing the coupling element. Furthermore, the space between the cover and the support is contaminated by the solvents released during the setting of the epoxy resin. Consequently, the semiconductor light source cannot be provided in either an evacuated space or a space filled with an inert gas.

SUMMARY OF THE INVENTION

An object of the invention is to provide a coupling element in which the positions of and distance between the lens (lens-shaped element) and the light source can be very accurately and simply adjusted and maintained, without requiring adhesive means such as epoxy resin, while at the same time the light source is enclosed in a hermetically sealed housing.

To this end, the coupling element according the invention is characterized in that the cover is shaped as a bushing and is connected to the support by way of a metal joint. The cover also has a flange on which the lens is secured by means of a plastic metal solder layer having a thickness of between 0.1 and 2 mm. The cover, the support, and the lens form a hermetically sealed space.

After the manufacture of such a coupling element, the plastic solder layer enables one to adjust the position of the lens with respect to the light source by displacement of the lens with respect to the cover. During the adjustment procedure, the solder layer is plastically deformed and the coupling element is and remains hermetically sealed. As a result, the coupling element can be advantageously manufactured in an inert gas atmosphere or in a vacuum, both of which are dust-free. Afterwards the lens can be adjusted with respect to the light source by manipulations outside this clean space. The micromanipulators required for the adjustment, therefore, need not be situated in the clean space, so that the production means required for the coupling element may be the same as or similar to the production means used for the manufacture of conventional transistors and diodes.

An embodiment of a coupling element according to the invention is characterized in that the lens is an assembly which includes both an annular metal holder and a lens which is mounted therein. The holder has a flange which is connected to the cover by way of the solder layer. An advantage of such an embodiment is that the holder, rather than the lens accommodated therein is mechanically stressed during the positioning of the lens assembly, so that the risk of damaging the lens during the adjustment procedure is reduced.

A preferred embodiment of a coupling element according to the invention is characterized in that the annular holder has an annular protrusion on which the lens is mounted. The protrusion and the lens are situated between the flange of the cover and the support.

Because the holder is arranged mainly in and the lens is arranged completely in the bushing-shaped cover, maladjustment of the position or distance of the lens with respect to the light source, for example due to rough handling of the holder during use or further processing of the coupling element, is avoided in a coupling element of this kind.

BRIEF DESCRIPTION OF THE DRAWING

Two embodiments according to the invention will be described in detail hereinafter with reference to the accompanying drawing.

DESCRIPTION OF THE PREFERRED EMBODIMENTS

Figure 1:
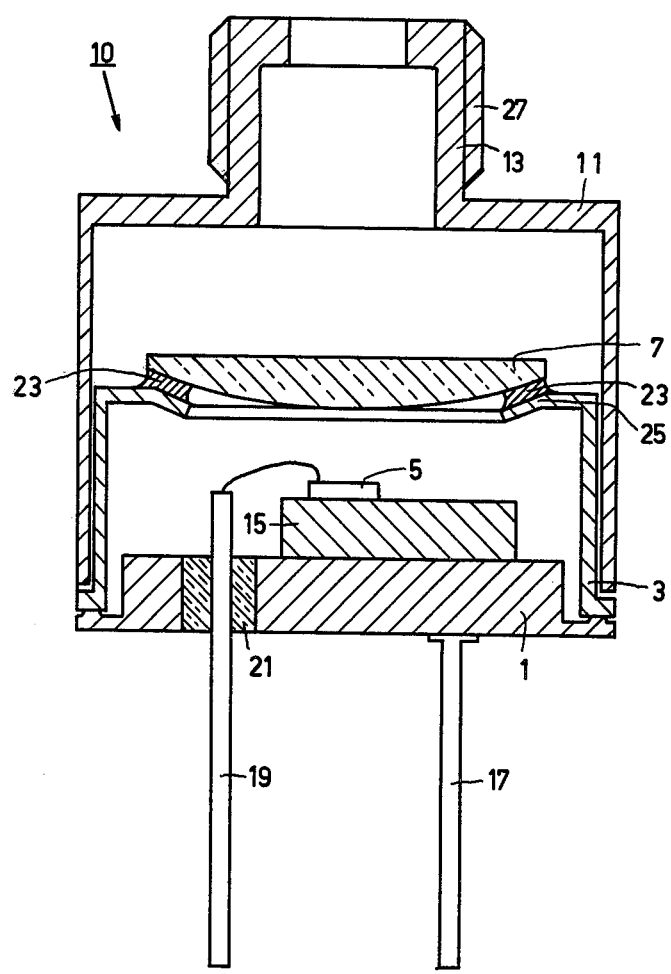
FIG. 1 is a cross-sectional view of an embodiment of a coupling element according to the invention.

The coupling element 10 shown in FIG. 1 comprises a support 1, a cover 3, a light-emitting diode 5, a lens 7 and a housing 11. The cover 3 is connected to the support 1 by way of a conventional welded joint (resistance weld). Via a cooling block 15, the diode 5 is mounted on the support 1 by means of a method which is the same as that used in the manufacture of semiconductors. Also connected to the support 1 is a connection wire 17 which is electrically connected to the diode 5 via the support 1 and the cooling block 15. A further connection wire 19 is electrically insulated from the support 1, via a glass passage 21, and is also connected to the (light source) diode 5.

The lens 7 is mounted on a flange 25 of the cover 3 by way of a plastic soldered connection 23 of indium. As a result, the lens 7 can be displaced in a direction towards the light source and in a plane perpendicular to this direction. The indium layer of the soldered connection 23 is then plastically deformed whilst the coupling element 10 remains hermetically sealed. The edge of the lens 7 is provided with a solderable silver layer or with another solderable metal layer by way of a silkscreening method, so that the lens 7 can be connected to the flange 25 of the cover 3 by way of an indium solder layer 23.

The lens 7 can alternatively be provided with a bonding layer such as titanium or chromium and subsequently with a solderable layer, such as platinum or nickel, by means of a known sputter technique.

The housing 11 is mounted on the cover 3 by means of an epoxy resin. This can be simply performed because the solvents of the epoxy resin cannot penetrate the hermetically sealed space in which the light source is accommodated. The housing 11 serves to protect the lens 7 against damage due to rough handling. Alternatively, the housing 11 can be mounted on the cover 3 by means of a clamp fit. The housing 11 is provided with thread 27 at an end 13. Further optical elements can be secured to this thread.

Figure 2:
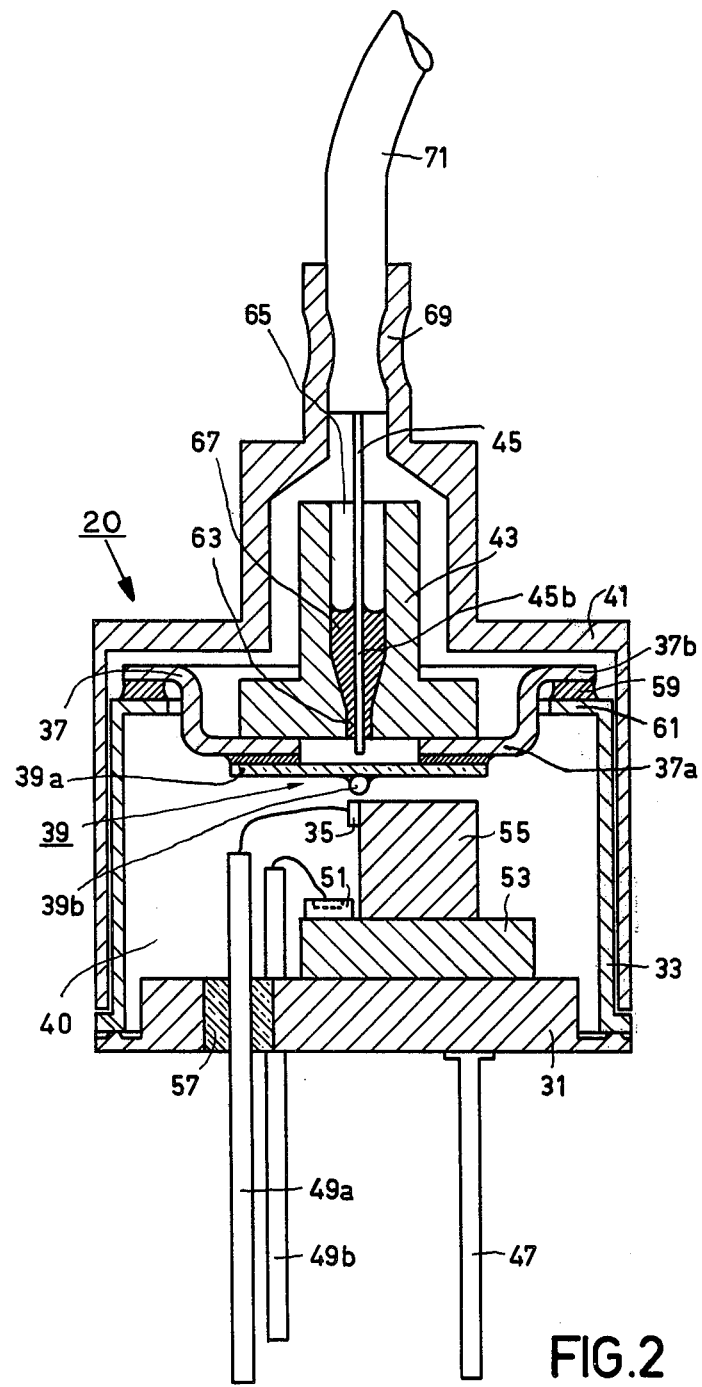
FIG. 2 is a cross-sectional view of a preferred embodiment of a coupling element according to the invention.

FIG. 2 shows a preferred embodiment of a coupling element 20 according to the invention. The coupling element 20 includes a support 31, a bushing-shaped cover 33, a light source 35 in the form of a semiconductor laser, an annular holder 37, a lens 39, a fiber housing 41 and a support 43 for an end of an optical fiber 45. The coupling element 20 further includes connection wires 47, 49a and 49b to which the semiconductor laser diode 35 and a light-sensitive semiconductor diode 51 are connected. The diode 51 measures the amount of light emitted on one side of the laser diode 35, so that the signal generated by the diode 51 can be used for controlling the emission of the laser diode 35. The connection wire 47 electrically contacts, via the support 31, the heat distribution block 55 and the cooling block 53. The diodes 35 and 51 which are also connected to the connection wires 49a and 49b, respectively. The connection wires 49a and 49b are secured in the support 31 by way of electrically insulating glass passages 57 (only one is shown).

The coupling element 20 is assembled as follows. A glass plate 39a and the holder 37 are simultaneously mounted on the flange 37a of the holder 37 and on the flange 61 of the cover 33, respectively, by means of indium solder layers. Subsequently, the lens 39b is cemented to the glass plate 39a by means of an epoxy resin. Obviously, the refractive indices of the glass plate 39a, the lens 39b and the epoxy resin are attuned to one another. The lens 39b is secured only after the flanges 61 and 37b are soldered together, and the glass plate 39a and the flange 37a are soldered together, so that the epoxy resin will not be discoloured by the soldering heat. Subsequently, the epoxy resin is cured and degased.

The assembly formed by the cover 33, the holder 37 and the lens 39 is secured to the support 31 by means of a known resistance weld. The lens 39 comprises a flat glass plate 39a on which a convex lens 39b is cemented by means of an epoxy resin. Therefore, the epoxy resin should be completely cured, before the lens 39 with the holder 37 and the cover 33 is mounted on the support 31, in order to ensure that the space 40 enclosed by the support 31, the cover 33, the holder 37 and the lens 39, is not contaminated by gases released from the epoxy resin during curing.

The thickness of the indium solder layer 59 should exceed 0.1 mm and be less than 2 mm, but is preferably between 0.5 and 1 mm. Preferably, there is a clearance of some tenths of a millimeter all around the holder 37 with respect to the cover 33. As a result, the convex lens 39b can be placed in the correct position and at the correct distance (in focus) from the laser diode 35 by shifting and by pressing the holder 37. The solder layer 59 is then plastically deformed, while the space 40 remains hermetically sealed. The space 40 is evacuated or filled with an inert gas, such as nitrogen or a noble gas, for protection of the diodes 35 and 51.

In order to couple optical fiber 45 to the laser-lens assembly, an end 45b of the fiber is slid into inlet aperture 65 of fiber support 43. The fiber is then slid down aperture 65 to central aperture 63 (not drawn to scale). Via inlet 65, a drop of (setting) glue 67 is introduced into the support 43. Subsequently, the support 43 is glued to the holder 37 after the fiber end 45b is aligned in the centering aperture 63 with respect to the light beam emerging from the lens 39b. Subsequently, the housing 41 is mounted on the cover, for example, by way of a clamping fit or by means of glue. A neck 69 of the housing 41 is constrained by means of a squeezing operation, so that a protective jacket 71 (secondary jacket) is clamped around the optical fiber 45 for strain relief of the fiber 45.

The covers 3 and 33, and the holder 37 may be made of, for example, nickel. The supports 1 and 31 are made of a nickel/iron alloy, for example, fernico. The housings 11 and 41 may be made of brass or aluminium, depending on the function of the housing. When the housing is provided with a thread (e.g. 27, FIG. 1), brass will preferably be used. When a jacket of an optical fiber (e.g. 67, FIG. 2) is secured in the housing by squeezing, use will preferably be made of aluminium. Instead of the described indium solder connections 23 and 59, other plastic solder connections can alternatively be used. Suitable materials in this respect are, for example, lead and metal alloys such as those of indium and/or lead.

What is claimed is:

1. A coupling element comprising:
   a support;
   a cover secured to the support;
   a light source mounted on the support inside the cover, said light source emitting a light beam when in operation; and
   a lens connected to the cover at a location opposite the light source in the path of the light beam emitted by the light source;
   characterized in that:
   the cover has a flange;
   the lens is connected to the cover at the flange, said lens being secured to the flange by way of a layer of plastic metal solder having a thickness of between 0.1 and 2 mm; and
   the support, the cover, and the lens form a hermetically sealed space containing the light source.

2. A coupling element as claimed in claim 1, characterized in that the cover is shaped like a bushing and the cover is secured to the support by way of a metal joint.

3. A coupling element comprising:

a support;
a cover secured to the support;
a light source mounted on the support inside the cover, said light source emitting a light beam when in operation; and
a lens connected to the cover at a location opposite the light source in the path of the light beam emitted by the light source;
characterized in that:
the cover has a flange;
the lens is connected to the cover at the flange, said lens being secured to the flange by way of a layer of plastic metal solder having a thickness of between 0.1 and 2 mm;
the support, the cover, and the lens form a hermetically sealed space containing the light source;
the cover is shaped like a bushing and the cover is secured to the support by way of a metal joint; and
the lens is an assembly made up of an annular metal holder and a lens which is mounted therein, said holder having a flange which is secured to the cover flange by the plastic metal solder layer.

4. A coupling element as claimed in claim 3, characterized in that the annular holder has an annular protrusion on which the lens is mounted, the protrusion and the lens being situated between the cover flange and the support.

5. A coupling element as claimed in claim 4, characterized in that the solder layer has a thickness of 0.5 to 1.0 mm.

6. A coupling element as claimed in claim 5, characterized in that the solder layer comprises indium.

7. A coupling element as claimed in claim 5, characterized in that the solder layer comprises an alloy of indium or lead.

* * * * *